United States Patent [19]

Nishizawa et al.

[11] Patent Number: 5,294,286
[45] Date of Patent: Mar. 15, 1994

[54] PROCESS FOR FORMING A THIN FILM OF SILICON

[75] Inventors: Junichi Nishizawa, 6-16, Komegafukuro 1-chome, Sandai-shi, Miyagi-ken; Hitoshi Abe, Sendai; Soubei Suzuki, 1-3, Otamayashita, Sendai-shi, Miyagi-ken, all of Japan

[73] Assignees: Research Development Corporation of Japan, Tokyo; Junichi Nishizawa, Miyagi; Oki Electric Industry Co., Ltd., Tokyo; Soubei Suzuki, Miyagi, all of Japan

[21] Appl. No.: 3,308

[22] Filed: Jan. 12, 1993

Related U.S. Application Data

[63] Continuation-in-part of Ser. No. 551,631, Jul. 10, 1990, abandoned, which is a continuation of Ser. No. 266,228, Oct. 28, 1988, abandoned, which is a continuation of Ser. No. 759,096, Jul. 25, 1985, abandoned.

[30] Foreign Application Priority Data

Jul. 26, 1984 [JP] Japan ................ 59-153978

[51] Int. Cl.$^5$ ............................................. C30B 25/14
[52] U.S. Cl. ..................................... 156/610; 156/611; 156/613; 156/614; 156/DIG. 64; 156/DIG. 80; 437/108; 437/241; 427/255.1
[58] Field of Search ............... 156/610, 611, 613, 614, 156/DIG. 73, DIG. 80, DIG. 64; 422/245; 423/53.1, 54.1, 86, 87, 248.1, 255.1; 118/725, 726; 219/411, 419; 437/108, 241

[56] References Cited

U.S. PATENT DOCUMENTS

| | | | |
|---|---|---|---|
| 2,841,477 | 7/1958 | Hall | 41/42 |
| 3,901,746 | 8/1975 | Boucher | 148/175 |
| 4,058,430 | 11/1977 | Suntola et al. | 156/611 |
| 4,160,690 | 7/1979 | Shibagaki et al. | 156/643 |
| 4,190,470 | 2/1980 | Walline | 148/175 |
| 4,223,048 | 9/1980 | Engle, Jr. | 427/39 |
| 4,277,304 | 7/1981 | Horiike et al. | 156/643 |
| 4,368,098 | 1/1983 | Manasevit | 156/606 |
| 4,413,022 | 11/1983 | Suntola et al. | 427/252.2 |
| 4,435,445 | 3/1984 | Allred et al. | 427/54.1 |
| 4,504,331 | 3/1985 | Kuech et al. | 156/345 |
| 4,522,674 | 6/1985 | Ninomiya et al. | 156/345 |
| 4,529,617 | 7/1985 | Chenevas-Paule et al. | 427/53.1 |
| 4,540,466 | 9/1985 | Nishizawa | 156/643 |
| 4,558,660 | 12/1985 | Nishizawa et al. | 118/725 |
| 4,624,736 | 11/1986 | Gee et al. | 156/643 |
| 4,645,687 | 9/1986 | Donnelly et al. | 427/53.1 |
| 4,699,688 | 10/1987 | Shastry | 156/606 |
| 4,806,321 | 2/1989 | Nishizawa et al. | 422/245 |
| 4,834,831 | 5/1989 | Nishizawa et al. | 156/311 |
| 4,975,252 | 12/1990 | Nishizawa et al. | 422/245 |
| 4,993,357 | 2/1991 | Scholtz | 156/610 |
| 5,082,798 | 1/1992 | Arimoto | 156/610 |
| 5,225,366 | 7/1993 | Yoder | 156/610 |
| 5,246,536 | 9/1993 | Nishizawa et al. | 156/610 |

FOREIGN PATENT DOCUMENTS

148277 12/1978 Japan.
82732 5/1984 Japan.
50169 3/1985 Japan.

OTHER PUBLICATIONS

M. Pessa et al., "Characterization of surface exchange reactions used to grow compound films", Appl. Phys. Lett. 38(3), Feb. 1, 1981, pp. 131-132.

M. Pessa et al., "Atomic Layer epitaxy and characterization of CdTe films grown on CdTe (110) substrates", J. Appl. Phys. 54(10), Oct. 1983, pp. 6047-6050.

M. Pessa et al., "Atomic Layer Epitaxy of CdTe on the Polar (111)A and (111)B Surfaces of CdTe Substrates", (List continued on next page.)

*Primary Examiner*—Gary P. Straub
*Attorney, Agent, or Firm*—Darby & Darby

[57] ABSTRACT

The thickness of a thin film of an element semiconductor may be determined by counting the number of cycles of gaseous component introductions within a crystal growth vessel. Each cycle permits at most one monolayer of growth since the pressure in the vessel during gaseous component introduction is maintained under a saturation condition. The temperature to which a substrate in the vessel is heated is that for which epitaxial growth results.

34 Claims, 12 Drawing Sheets

OTHER PUBLICATIONS

Journal of Crystal Growth 67 (1984), pp. 255–260.

M. Ahonen et al., "A Study of ZnTe Films Growth on Glass Substrates Using an Atomiclayer Evaporation Method", Thin Solid Films, 65 (1980) 301–307.

Jun–ichi Nishizawa, "Doping in Molecular Layer Epitaxy", Reprinted from Journal of the Electro Chemical Society, vol. 136, No. 2, Feb. 1989, pp. 478–484.

S. M. Bedair et al., "Atomic layer epitaxy of III–V binary compounds", Appl. Phys. Lett., vol. 47, No. 1, Jul. 1, 1985, pp. 51–53.

Lewis M. Fraas, "A new low temperature III–V multilayer growth technique: Vacuum metalorganic chemical vapor deposition", J. Appl. Phys. 52(11), Nov. 1981, pp. 6939–6943.

Theodore L. Brown, "General Chemistry", § 17–2, "The Effect of External Variables on the Value of the Equilibrium Constant", pp. 278–282, 1963.

G. M. Guro et al., "Activation of the Growth of Epitaxial Layers of Narrow–Band Semiconductors by Light Radiation", Sov. Phys.–Lebedev Inst. Rep. (USA), 1978, pp. 22–26.

P. Daniel Dapkus, "Metalorganic Chemical Vapor Deposition", Ann Rev Mater Sci, 1982, pp. 243 & 259.

Jun–ichi Nishizawa et al., "Molecular Layer Epitaxy in Gallium Arsenide", ACTA Polytechnica Scandinavia, Chemical Technology and Metallurgy Series No. 195, UDC 539.23:541.17:621.315.59, 1st International Symposium of Atomic Layer Epitaxy, 1990, pp. 1–15.

John F. O'Hanlon, "A User's Guide to Vacuum Technology" in Japanese, Jul. 30, 1958, pp. 65–91.

Irving Langmuir, "The Adsorption of Gases on Plane Surfaces of Glass, Mica and Platinum", The Journal of the American Chemical Society, vol. XL, Jul.–Dec. 1918, pp. 1361–1403.

James W. McBain et al., "The Nature of the Sorption by Charcoal of Gases and Vapors Under Great Pressure", The Journal of the American Chemical Society, vol. 52, No. 5, May 1930, pp. 2198–2222.

Stephen Brunauer et al., "The Use of Low Temperature van der Waals Adsorption Isotherms in Determining the Surface Areas of Various Adsorbents", The Journal of the American Chemical Society, vol. LIX, 1937, pp. 2682–2689.

Jun–ichi Nishizawa et al., "Silicon Molecular Layer Epitaxy", J. Electrochem. Soc. vol. 137, No. 6, Jun. 1990, pp. 1898–1904.

Jun–ichi Nishizawa et al., "Molecular Layer Epitaxy of Silicon", Journal of Crystal Growth 99 (1990) pp. 502–505.

Kenji Aoki et al., "Silicon Molecular Layer Epitaxy", Denshi Tokyo No. 30 (1991), pp. 33–37.

Jun–ichi Nishizawa et al., "Surface reaction mechanism in Si and GaAs crystal growth", Surface Science Reports, review journal, vol. 15, Nos. 4/5, 1992 pp. 137–204.

Tohru Kurabayashi et al., "Photoexcited Molecular Layer Epitaxial Growth Process of GaAs, GaAlAs, and Si; and Photo–Vapor Phase Epitaxy of GaAs", Project for Promoting the Development of Creative Science & Technology, Research Development Corporation of Japan, Nishizawa Project on Perfect Crystals, Dec. 19, 1986, pp. 2–7.

Irving Langmuir, "The Constitution and Fundamental Properties of Solids and Liquids", The Journal of the American Chemical Society, vol. XXXVIII, Jul.–Dec. 1916, pp. 2221–2295.

PROCESS FOR FORMING A THIN FILM OF SILICON

CROSS-REFERENCE TO COPENDING APPLICATIONS

This a continuation-in-part of U.S. Ser. No. 07/551,631, filed Jul. 10, 1990, now abandoned, which is in turn a continuation of U.S. Ser. No. 07/266,228, filed Oct. 28, 1988, now abandoned and which is in turn a continuation of U.S. Ser. No. 06/759,096, filed Jul. 25, 1985, now abandoned.

BACKGROUND OF THE INVENTION

1. Field of the Invention

The present invention relates to a process for forming a monocrystalline thin film of silicon, which is suitable for formation of monocrystal growth layers of the element semiconductor of silicon with precision as precise as a single monolayer.

2. Discussion of related art

A chemical vapor deposition process (referred to hereinafter as a CVD process) and a molecular beam epitaxy (referred to hereinafter as an MBE process) are well known in the art as vapor phase epitaxial techniques for forming a crystalline thin film of an element semiconductor consisting of a single element such as silicon. According to the CVD process, a silicon compound, which is a source, and gas such as hydrogen gas, which is a carrier, are simultaneously introduced into a reaction chamber to cause growth of a crystal by means of thermal decomposition. However, the thermal decomposition results in a poor quality of the crystal layer formed by growth. The CVD process is also defective in that difficulty is encountered for controlling the thickness of the layer with precision as precise as a single molecular layer.

On the other hand, the MBE process is well known as a crystal growth process making use of a ultrahigh vacuum. This process, however, includes physical adsorption as its first step. Therefore, the quality of the crystal is inferior to that provided by the CVD process which makes use of a chemical reaction. Further, due to the fact that the sources themselves are disposed in a growth chamber, it is difficult to control the amount of gases produced by heating the sources, to control the rate of vaporization of the sources and to replenish the sources, resulting in difficulty of maintaining a constant growth rate for a long period of time. Further, the evacuating device discharging, for example, the vaporized matters becomes complex in construction. Furthermore, it is difficult to precisely control the stoichiometric composition of the compound semiconductor. Consequently, the MBE process is defective in that a crystal of high quality cannot be obtained.

In the MBE process, individual component elements of a compound semiconductor are simultaneously deposited by vacuum evaporation. An atomic layer epitaxial process (referred to hereinafter as an ALE process) is an improvement over the MBE process. This ALE process is featured by alternately depositing individual component elements of a compound semiconductor, as disclosed in U.S. Pat. No. 4,058,430 (1977) to T. Suntola et al. and also in J. Vac. Sci. Technol. A2, (1984), page 418 by M. Pessa et al. Although the ALE process is suitable for the growth of a I-VII compound, a II-VI compound, a III-V compound or an oxide of such elements, an excellent crystalline property cannot be expected inasmuch as the ALE process is an extension of the MBE process. Rather, the ALE process is suitable for the growth of a crystal on a substrate of glass, and it is difficult with the ALE process to achieve selective epitaxial growth of a crystal which is important in the field of production of semiconductor integrated circuits and the like. An attempt has been made to attain crystal growth by the ALE process utilizing a chemical reaction instead of resorting to the ALE process utilizing the vacuum evaporation. Although the attempt has succeeded in the formation of a polycrystalline II-VI compound such as ZnS or an amorphous compound such as $Ta_2O_5$, it has not been successful for the growth of a single crystal. As described in U.S. Pat. No. 4,058,430 (1977), the ALE process is based on the principle of depositing a monomolecular layer of one of component elements of a compound on a monomolecular layer of another component element of the compound. Therefore, the ALE process is limited to the growth of a thin film of a compound and is not applicable to the growth of an element semiconductor such as Si or Ge. On the other hand, one of the inventors has reported, in a magazine entitled "Electronic Materials", December 1981, page 19, as to the possibility of application of a developed version of the ALE process to the growth of a single crystal of Si. However, the paper does not teach any practical information of the factors including the growth temperature and gas introduction rate.

Thus, with the CVD process and MBE process, it is difficult to form a high-quality crystal with precision as precise as a single molecular layer. With the ALE process, a single crystal cannot be formed by growth, and, especially, growth of an element semiconductor such as Si or Ge is impossible in principle.

U.S. Pat. No. 4,834,831, whose contents are incorporated herein by reference, discloses a method for growing a single crystal thin film of an element semiconductor. Under the growth chamber environmental conditions employed, the results show that the film thickness grown per cycle varies continuously in response to variations in substrate temperature or feeding pressure from a half molecular layer (0.68 Angstroms) to a monomolecular layer (1.36 Angstroms) to a dimolecular layer (2.72 Angstroms). Due to this continuous variation in growth of the molecular layer per cycle in response to variations in temperature or pressure, the environmental conditions within the growth chamber require precise control.

A research paper entitled "PROJECT FOR PROMOTING DEVELOPMENT OF CREATIVE SCIENCE & TECHNOLOGY, NISHIZAWA PROJECT ON PERFECT CRYSTALS, COLLECTIVE SUMMARIES OF RESEARCHES", Research Development corporation of Japan, dated Dec. 10, 1986, discloses in section 2.6 the molecular layer epitaxy of Si by means of a $SiH_2Cl_2$ system in which $SiH_2Cl_2$ and $H_2$ are alternately introduced as raw gases into a crystal growth chamber and onto a substrate of Si heated in a vacuum. Although the paper fails to discuss the selection criteria used for deciding upon appropriate values of temperature, pressure, duration of gaseous compound introduction or duration of vacuum within the growth chamber that were used in the experiment, it does mention some results.

This research paper mentions that when $H_2$ is used with its pressure greater or equal to $3.0 \times 10^{-5}$ Torr, the film growth thickness per cycle tends to saturate for the pressure of $SiH_2Cl_2$ of from $2.0 \times 10^{-4}$ to $7.0 \times 10^{-4}$ Torr. The saturation thickness of the film growth corresponds to the thickness of a single atomic layer. Further, the film growth thickness per cycle shows a steep rise over the thickness of a single atomic layer when the pressure of $SiH_2Cl_2$ is increased over the value of $7.0 \times 10^{-4}$ Torr. When the pressure of $SiH_2Cl_2$ is less than or equal to $1.0 \times 10^{-4}$ Torr, the film growth thickness per cycle is determined by the pressure of $SiH_2Cl_2$ irrespective of the pressure of $H_2$.

Also, the substrate temperature dependence of the film growth thickness per cycle was investigated. The film growth per cycle shows a steep rise near and above a temperature of 890 degrees Celsius; between 825 to 890 degrees Celsius the film growth was fairly constant at just beneath about one Angstrom.

It would be desirable to exploit the experimental results mentioned in this research paper commercially to achieve semiconductor thin film growth as precise as a monolayer.

SUMMARY OF THE INVENTION

An aspect of the invention relates to a process for growing a monocrystalline thin film of silicon on a silicon substrate located in a crystal growth vessel to a desired thickness by counting the number of cycles of alternating supply of gaseous compounds and evacuation, whereby only a monolayer of growth occurs per cycle because of a saturation or self-limiting growth rate properly due to the surface chemisorption reaction during the supply. The amount of each alternating supply of gases takes into account the surface area of the substrate and the rate of evacuation in determining appropriate values of substrate temperature, growth chamber pressures and durations of alternating gaseous component introductions and evacuation.

The steps include effecting monomolecular growth by:

(a) evacuating the interior of the crystal growth vessel to a pressure preferably within a range of from about $10^{-7}$ to $10^{-8}$ Pascal, (b) heating the substrate at a temperature within a range of from about 700 to 900 degrees Celsius for effecting the epitaxial growth at the selected corresponding gas introduction pressure and duration of introduction, (c) introducing onto the substrate disposed in the growth vessel a first supply of gaseous molecules of a $SiH_2Cl_2$ under a saturation pressure condition corresponding to the temperature at which the substrate is heated and maintained, the duration of the introducing being within a range of 0.5 to 200 seconds and greater than the minimum duration necessary to form a single molecular adsorbed layer (ad-layer) of a compound dissociated from $SiH_2Cl_2$ on the substrate under the saturated pressure condition, said ad-layer of compound containing silicon, (d) removing molecules other than those which form the single molecular ad-layer by the evacuating of the interior of said crystal growth vessel, (e) introducing a second supply of gaseous molecules reactable with the single molecular ad-layer, the duration of the introducing of the second supply of gaseous molecules being within a range of 0.5 to 200 seconds and being under a saturation pressure condition so as to chemically react with the single molecular ad-layer to form gaseous molecules of a reactant compound, (f) removing molecules of said second supply and said reactant compound by the evacuating of the interior of the crystal growth vessel so as to leave a monocrystalline thin film with the thickness of a single molecular layer of silicon, (g) cyclically repeating the steps (c) to (f) and maintaining the substrate at the temperature to grow the thin film of silicon on the substrate to a desired thickness which is dimensionally as precise as that for a single molecular layer, and (h) continuously evacuating the crystal growth chamber during steps (c) to (g) at a substantially constant rate of evacuation. The desired thickness is attained by cycling the sequence of steps (c) to (f) by a plurality of times equivalent to an integral result of a division of the desired thickness by the thickness of a single molecular layer of silicon. The gaseous molecules being introduced includes a respective amount which is in excess of that necessary for forming just the single molecular layer of silicon during each cycle even taking into account a removal rate of the gaseous molecules caused by the evacuation taking place during steps (c) and (e).

When the above process is modified to include gaseous molecules containing those of an impurity element of silicon being introduced simultaneously or alternately with $SiH_2Cl_2$ or the gaseous molecules chemically reactable with the single molecular ad-layer, the impurity element can be distributed with a desired impurity concentration distribution in the thicknesswise direction of the film, or a molecular layer containing the impurity element and a molecular layer not containing the impurity element can be cyclically formed.

Further, since the doping with the impurity can be made in one layer after another while taking into consideration the compensation of the distortion of the crystal lattices of the mother semiconductor due to the impurity doping, a very steep impurity concentration distribution can be provided while maintaining the good crystalline quality of the film, so that a semiconductor device capable of operating at a very high speed with a satisfactory operating characteristic can be produced.

BRIEF DESCRIPTION OF THE DRAWINGS

For a better understanding of the present invention, reference is made to the following description and accompanying drawings, while the scope of the invention is set forth in the appended claims.

FIG. 3 illustrates the case of doping silicon (Si) with both of germanium (Ge) and boron (B), wherein

DESCRIPTION OF THE PREFERRED EMBODIMENT

Figure 1:
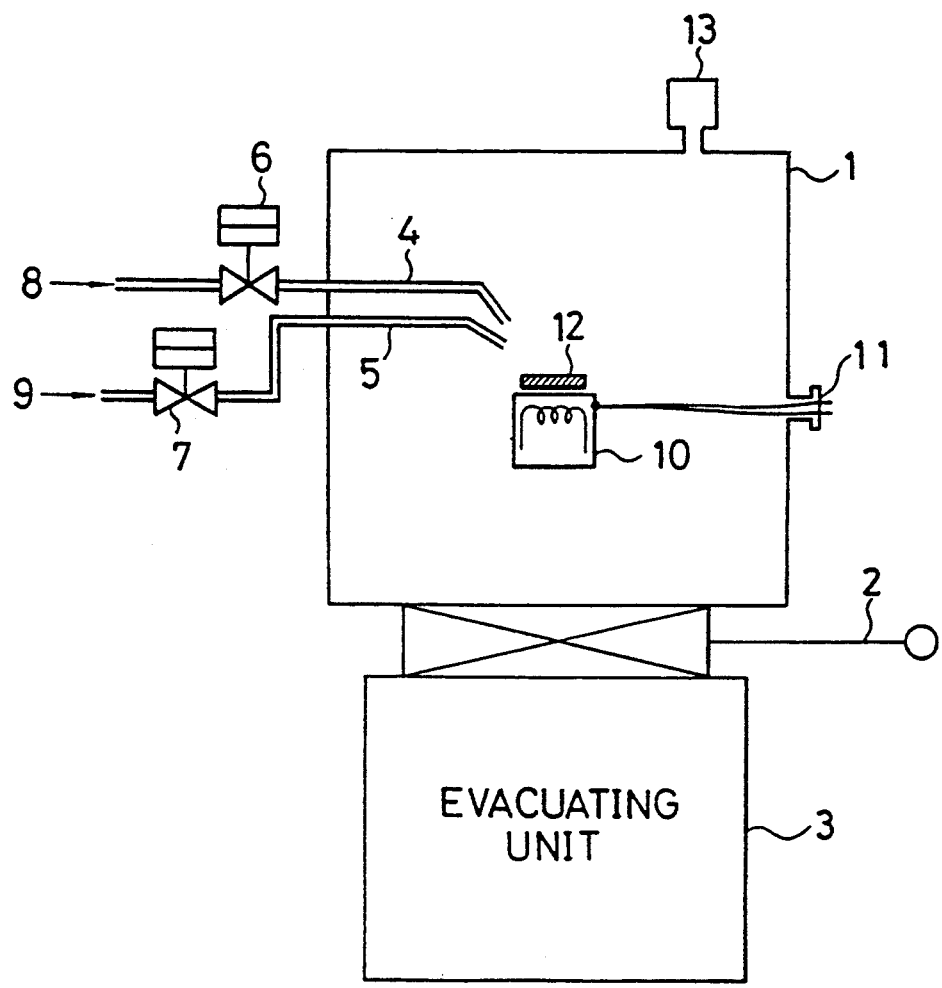
FIGS. 1 and 2 are diagrammatic views showing the construction of crystal growth apparatus preferably used for practice of embodiments of the process according to the present invention, respectively.

Referring to FIG. 1, a crystal growth vessel 1 is made of a metal such as stainless steel. The growth vessel 1 is coupled through a gate valve 2 to an evacuating unit 3 which evacuates the interior of the vessel 1 to a ultrahigh vacuum. Nozzles 4 and 5 extend into the growth vessel 1 for introducing a gaseous compound containing a component element of the IV group and a gaseous compound chemically reactable with the aforementioned gaseous compound, respectively. The nozzles 4 and 5 are provided with on-off valves 6 and 7 controlling the introduced amounts of the gaseous compound 8 containing the component element of the IV group and the gaseous compound 9 chemically reactable with the gaseous compound 8, respectively. A heater 10 for heating a substrate 12 is disposed in the growth vessel 1, and a thermocouple 11 is associated with the heater 10 for measuring the temperature of the substrate 12. The heater 10 includes a tungsten filament sealed in a quartz glass tube, and the substrate 12 formed of an element semiconductor is mounted on the heater 10. A pressure gauge 13 for measuring the value of the internal vacuum is also disposed on the growth vessel 1.

The present invention is directed to a method of controlling a thickness of a thin film during its growth within the growth chamber 1 during alternate cycling of gas component introduction onto a heated substrate and evacuation of remaining gas without the need for controlling exact pressure and duration of component gas introduction and evacuation. By introducing the gaseous components under a predetermined saturated pressure condition, only a single monomolecular growth will occur per cycle. The thickness of the thin film may thus be calculated readily by merely counting the number of cycles, because only one monolayer is grown per cycle. The thickness of a monolayer in forming the present thin film on (100) crystal surface is known to be 1.36 Angstroms. If grown on a (111) crystal face, the thickness of the monolayer is 1.57 Angstroms. Such monolayer thickness, for instance, is known from FIGS. 1 and 2 of J. Crystal Growth 99 (1990), pages 502–505.

Initially, the minimum pressure of gas component introduction and duration is determined. In this regard, the number of gas component molecules necessary for constituting a monolayer which covers a unit surface area of the substrate can be calculated by multiplying the gas component introduction pressure by the duration, thereby yielding the introduced quantity. By taking into account a sticking coefficient for the introduced gas component, a minimum product of pressure and duration for obtaining epitaxial growth can be readily determined. In this way, a sufficient gaseous molecular flow to more than cover the substrate with a monolayer may be determined, taking into account the rate of evacuation of the crystal growth chamber (since evacuation will be continuous) and the sticking coefficient. The sticking coefficient is based on a surface reaction probability and a surface collision probability of the gaseous components being introduced, the surface collision probability being estimated by taking into account a relative geometry of the substrate, growth chamber and gas introducing nozzles. In the case of $SiH_2Cl_2$ and $H_2$, the sticking coefficient is known.

Based on the above discussion, the number of molecules necessary for forming a monolayer of $SiH_2Cl_2$ determines the appropriate product of pressure and duration of gas component introduction necessary for realizing that number. Similarly, the number of molecules of a doping gas necessary for attaining a desired doping level relative to the quantity of Si may be calculated in the same manner so that the product of doping gas introduction pressure and duration can be determined.

Since each cycle involves alternating gas component introductions and evacuations, the duration of evacuation between introductions needs to be determined. This is done by taking the evacuation characteristic of the growth chamber into account. In this regard, a duration of evacuation is recommended which recovers the vacuum to about 1/10 to 1/100 in pressure relative to that during the introduction of the $SiH_2Cl_2$. A duration longer than several seconds is usually sufficient. While there is some flexibility in selecting the evacuation duration within a rather wide range, selecting a long duration slows down the monolayer growth process perhaps by too much, making it impracticable for production purposes.

Next, an appropriate substrate temperature must be selected; epitaxial growth of Si in a conventional growth process is known to occur within the range of 800 to 1100 degrees C. Epitaxial growth may be observed, in a known manner, by measuring the epitaxial grown film thickness with an electron microscope or stylus profiler.

However, all of such temperatures which are suitable for epitaxial growth are not necessarily suitable for attaining monolayer growth. For the present inventive growth process which uses $SiH_2Cl_2$, the range of temperatures within which the grown film thickness becomes nearest to that of the monolayer (1.36 Angstroms on (100) surface or 1.57 Angstroms on (111) surface) falls within the epitaxial temperature range of between about 700–900 degrees Celsius. Monolayer growth thickness may be measured using the same tools as those used for measuring epitaxial growth thickness. Once monolayer growth is observed, the appropriate substrate temperature and product of gas component introduction pressure and duration become known.

Since the gaseous component of $SiH_2Cl_2$ is used and the substrate temperature falls within the range of 700 to 900 degrees Celsius, a preferred range of gas introduction pressure is between $3 \times 10^{-3}$ to $10^{-1}$ Pascals. The minimum pressure of $3 \times 10^{-3}$ Pascals may be determined readily because the density of surface atoms of the substrate is about $10^{15}$ cm$^{-2}$ as described at col. 7 line 16 of U.S. Pat. No. 4,058,430.

Although the product of pressure and duration determines the number of introduced molecules, as described above, the selection of too long a duration leads to an impractical length of time for crystal growth. Thus, a minimum pressure of $3 \times 10^{-3}$ Pascals is recommended. Selection of other temperatures, pressures and durations within the ranges mentioned above may be readily effected as desired by taking into consideration the evacuation rate and gas introduction nozzle characteristics of the specific growth chamber apparatus selected.

The final step is to grow the thin film to the desired thickness. This is attained by repeating the cycle of alternating depositions as many times as necessary until the desired thickness is realized. Since each cycle only allows for growth of one monolayer, the number of monolayers required to attain the desired thickness is the same as the number of cycles to be performed. Thus, one need only divide the desired thickness by 1.36 Angstroms on (100) surface or 1.57 Angstroms on (111) surface and then cycle the growth process for that same number of times.

The duration of introduction of the alternating gaseous component, such as $H_2$, is determined in a like manner as that for $SiH_2Cl_2$, i.e., so that the number of molecules supplied is at least sufficient for constituting one monolayer of growth.

If desired, a saturation condition may be determined, that is, the monolayer formation range. The product of pressure and duration may be calculated to determine maximum and minimum products of the endpoints of pressure, which are $3 \times 10^{-3}$ and $10^{-1}$ Pascals, and the endpoints of duration, which are 0.5 and 200 seconds.

Thereafter, experiments are conducted to identify the monolayer formation range by ascertaining the saturated pressure condition. While heating the substrate to the selected temperature for attaining monolayer growth, the maximum product (e.g., 20 Pa sec) is reduced by factors of ten toward the minimum product (e.g., $1.5 \times 10^{-3}$ Pa sec) until a monolayer formation range is identified and its endpoints determined experimentally. With respect to the minimum product (e.g., $1.5 \times 10^{-3}$ Pa.sec), however, it should be the one corresponding to the number of adsorbed molecules more than that of surface atoms of silicon substrate ($6.8 \times 10^{14}$ atoms/cm$^2$). Anyway, the minimum product can be estimated by taking evacuation rate, evacuation cross section and sticking coefficient in to account. This monolayer formation range corresponds to a saturation pressure range. The saturation condition is thus found easily by successively changing the gas introduction pressure by a small amount and measuring the grown film thickness so that a maximum range of pressure within which the grown film thickness is kept at a constant thickness of the monolayer.

A monocrystalline thin film of an element semiconductor such as silicon is formed in a manner as described herein under by the crystal growth apparatus having the construction shown in FIG. 1. Suppose, for example, the case of epitaxial growth of a single crystal of Si on the substrate 12 of Si. First, the growth vessel 1 is evacuated to a vacuum of about $10^{-7}$ to $10^{-8}$ Pascal (abbreviated hereinafter as Pa) by opening the gate valve 2 and operating the ultrahigh-vacuum evacuating unit 3. Then, the Si substrate 12 is heated up to 700° to 900° C. by the heater 10, and gaseous $SiH_2Cl_2$ (dichlorosilane) 8 is introduced, as gas containing Si, into the growth vessel 1 by holding the valve 6 open for 0.5 to 10 sec and maintaining the internal pressure of the growth vessel 1 at 1 to $10^{-7}$ Pa, preferably $10^{-1}$ to $10^{-3}$ Pa. After closing the valve 6 and exhausting the gas from within the growth vessel 1, $H_2$ gas 9 is introduced, as gas chemically reacting with the $SiH_2Cl_2$ gas, into the growth vessel 1 by holding open the valve 7 for 2 to 200 sec and maintaining the internal pressure of the growth vessel 1 at 1 to $10^{-6}$ Pa, preferably $10^{-1}$ to $10^{-7}$ Pa.

As a result, at least one molecular layer of Si grows on the substrate 12. Thus, by repeating the above steps to cause successive growth of monomolecular layers, an epitaxial growth thin film of Si having a desired thickness can be formed with precision as precise as a single molecular layer.

It is preferred that the evacuating unit 3 be operated continuously with the gate valve 2 remaining open throughout each cycling of the sequence of the above steps. This speeds up the growth process by avoiding the need to wait until the evacuation unit 3 reaches the ultra-high vacuum level after each gaseous molecule introduction, avoids deterioration in thin film purity otherwise caused from unwanted reactions in the thin film due to the lingering presence of remaining gaseous molecules, and also minimizes wear on the evacuation unit 3 which otherwise would need to be rapidly cycled on and off or minimizes wear on the gate valve 2 if cycled open and closed instead.

Thus, the rate of evacuation is maintained at substantially the same constant rate during the whole growth process and this rate of evacuation is taken into account when determining the sufficient amount of gaseous molecules to be introduced during each cycle for growing a single molecular layer. This amount will be in excess of that needed to form just a single molecular monolayer because the need for precise control of exact amounts may be dispensed with according to the invention. Indeed, growth of the thin film during any cycle need not even be measured because the rate of growth is known, i.e., one molecular monolayer of silicon per cycle. In view of this continuous evacuation, the gaseous molecules are introduced directly onto the substrate by arranging the nozzles 4, 5 directly over the substrate. Preferably the rate of evacuation is at the ultrahigh vacuum, for example, $10^{-7}$ to $10^{-8}$ Pa.

Figure 2:
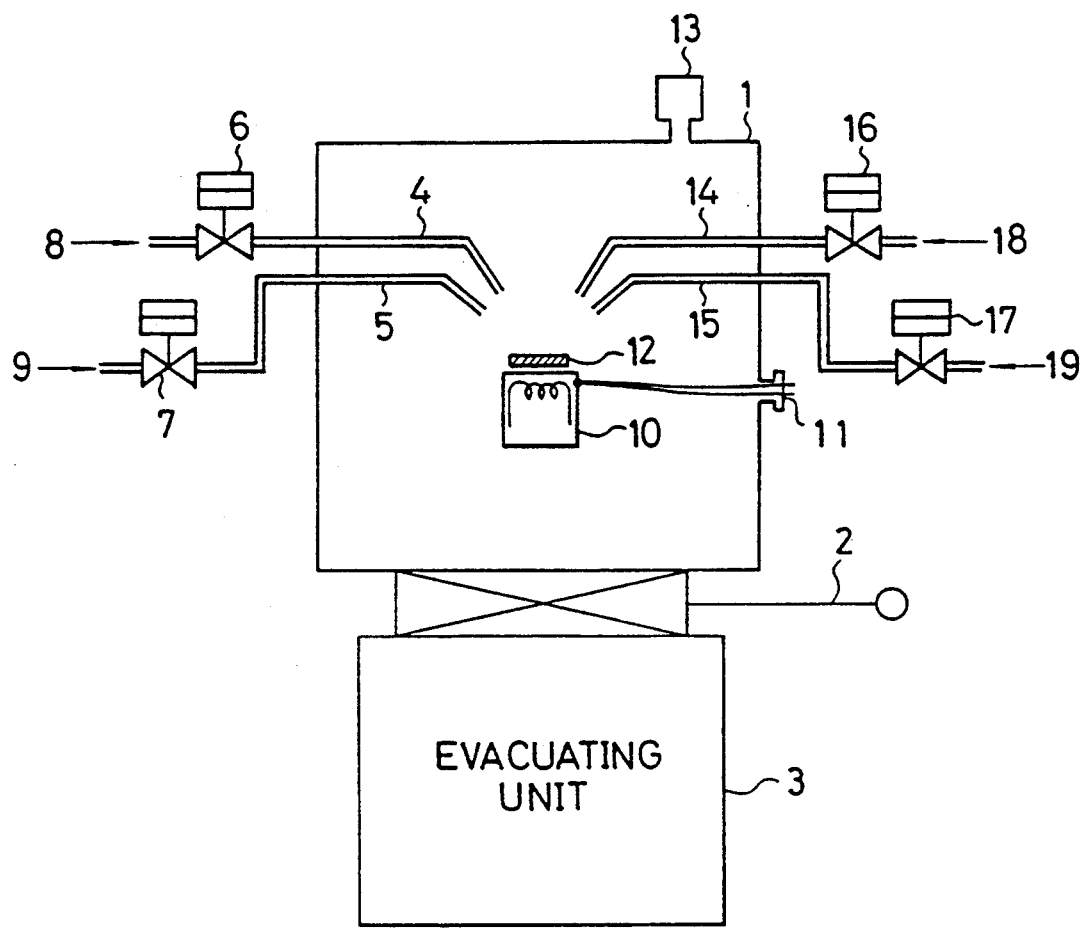

FIG. 2 shows a crystal growth apparatus adapted for carrying out another embodiment of the present invention which is substantially identical to the embodiment discussed previously with respect to FIG. 1, except that FIG. 2 makes provision for including impurity doping. The same reference numerals are used to designate the same or equivalent parts appearing in FIG. 1.

The apparatus shown in FIG. 2 differs from that shown in FIG. 1 in that nozzles 14 and 15 for introducing gaseous compounds into the growth vessel 1 for the purpose of impurity doping are additionally provided, and that on-off valves 16 and 17 are provided on the nozzles 14 and 15 respectively so that the amount of a gaseous compound 18 containing a component element of the III group and that of a gaseous compound containing a component element of the V group, introduced into the growth vessel 1, can be regulated.

When growth of an n-type layer by the apparatus is desired, three gases, that is, $SiH_2Cl_2$ gas (dichlorosilane) 8, $H_2$ gas (hydrogen) 9 and $AsH_3$ gas (arsine) 18 as an impurity gas are cyclically introduced into the growth vessel 1. As another method, the $SiH_2Cl_2$ gas 8 and $AsH_3$ gas 18 are introduced simultaneously but alternately with the $H_2$ gas 9, or the $H_2$ gas 9 and $AsH_3$ gas 18 are introduced simultaneously but alternately with the $SiH_2Cl_2$ gas 8, for doping with the impurity. Further, the $H_2$ gas 9 may not be introduced, and the $SiH_2Cl_2$ gas 8 and $AsH_3$ gas 18 may be repeatedly alternately introduced.

As another method, a first cycle of alternately introducing the $SiH_2Cl_2$ gas 8 and $H_2$ gas 9, and a second cycle of simultaneously introducing the $SiH_2Cl_2$ gas 8 and $AsH_3$ gas 18 but alternately with the $H_2$ gas 9, are alternately repeated, so as to cyclically alternate and form a layer doped with As and a layer not doped with As. Further, a third cycle of simultaneously introducing the $SiH_2Cl_2$ gas 8 and $PH_3$ gas (phosphine) but alternately with the $H_2$ gas 9 may be added so as to cyclically form a layer doped with As whose atomic radius is larger than that of Si, a layer doped with P whose atomic radius is smaller than that of Si and a layer of Si only, thereby compensating crystal lattice distortion attributable to the difference of the atomic radii of the impurities from that of the mother semiconductor.

As the source of impurity doping gas, $AsCl_3$ (arsenic trichloride), $PCl_3$ (phosphorous trichloride) or the like can also be used.

Figure 3A:
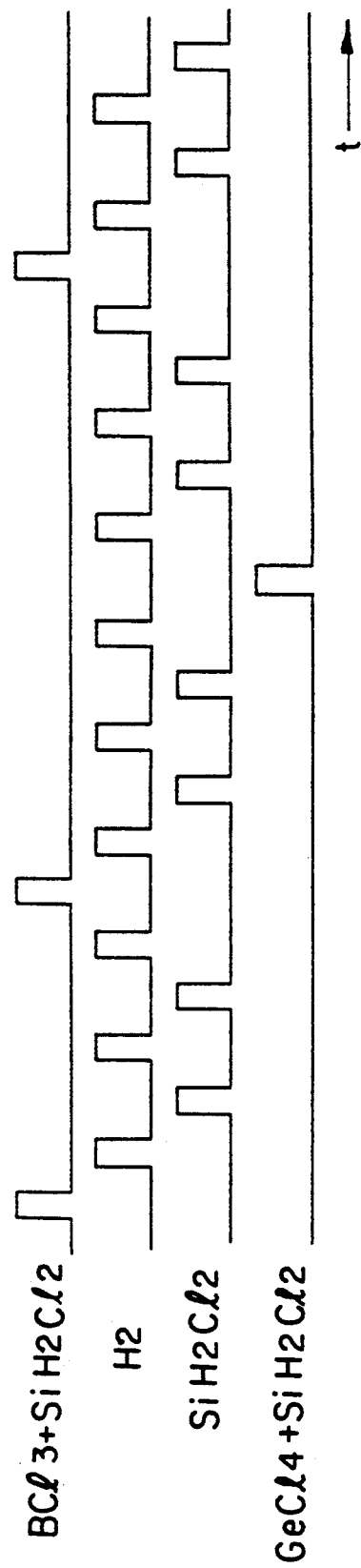
FIG. 3A is a sequence chart of gases introduced in pulse forms.
Figure 3B:
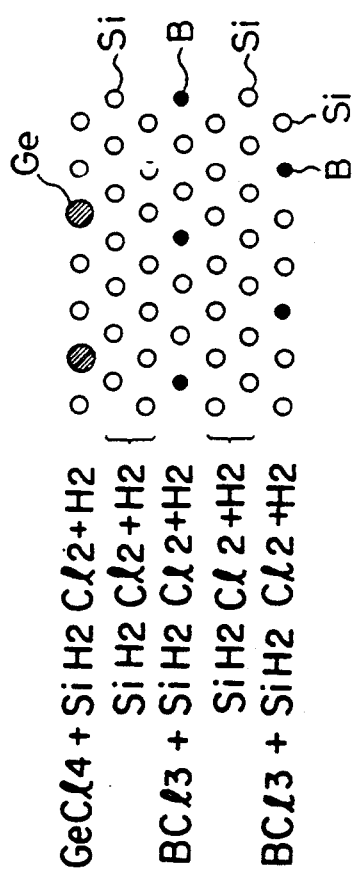
FIG. 3B is a schematic view of a growth layer doped with Ge and B.

FIG. 3 illustrates the case where Si is doped cyclically at a constant ratio with Ge whose atomic radius is larger than that of Si and with B whose atomic radius is smaller than that of Si. As shown in FIG. 3A, $BCl_3$ gas and $SiH_2Cl_2$ gas are initially simultaneously introduced, and $H_2$ gas is then introduced. As a result, a molecular layer in which Si is doped with B is formed as shown in FIG. 3B. Subsequently, a cycle of introducing $SiH_2Cl_2$ gas, exhausting $SiH_2Cl_2$ gas, and introducing $H_2$ gas according to the sequence shown in FIG. 3A is repeated two times to form two molecular layers of crystalline Si, as shown in FIG. 3B. Thereafter, similarly, introduction of $BCl_3$ gas and $SiH_2Cl_2$ gas, exhausting of these gases and introduction of $H_2$ gas forms one molecular layer of Si doped with B; introduction of $SiH_2Cl_2$ gas, exhausting of these gases and introduction of $H_2$ gas are repeated two times to form two molecular layers of Si; and introduction of $GeCl_4$ gas and $SiH_2Cl_2$ gas, exhausting of these gases and introduction of $H_2$ gas forms one molecular layer of Si doped with Ge.

On the other hand, when formation of a p-type growth layer by the apparatus is desired, $B_2H_6$ gas (diborane) 19 shown in FIG. 2 is cyclically introduced as an impurity gas, together with $SiH_2Cl_2$ gas 8 and $H_2$ gas 9. As another method, the $SiH_2Cl_2$ gas 8 and $B_2H_6$ gas 19 are introduced simultaneously but alternately with the $H_2$ gas 9, for doping with the impurity.

The impurity gas may be $BCl_3$ gas, $BBr_3$ gas, TMG gas (trimethyl gallium), TMAl gas (trimethyl aluminum), TMIn gas (trimethyl indium) or the like.

In this case, the flow rate of the introduced impurity gas is preferably selected to be less by, for example, $10^{-3}$ to $10^{-6}$, than those of the $SiH_2Cl_2$ gas 8 and $H_2$ gas 9, and the length of time of gas introduction is preferably selected to be about 0.5 to 10 sec so as to form a molecular epitaxial growth layer having a desired impurity concentration distribution in the thickness-wise direction. Further, it is apparent that, by suitably regulating the amount and duration of introduction of the impurity gases, it is possible to provide pn junctions, non-uniform impurity concentration distributions, bipolar transistor structures such as npn, npin, pnp and pnip structures, field effect transistor structures such as n+in+ and n+n-n+ structures, static induction transistor structures, pnpn thyristor structures, etc.

Figure 4:
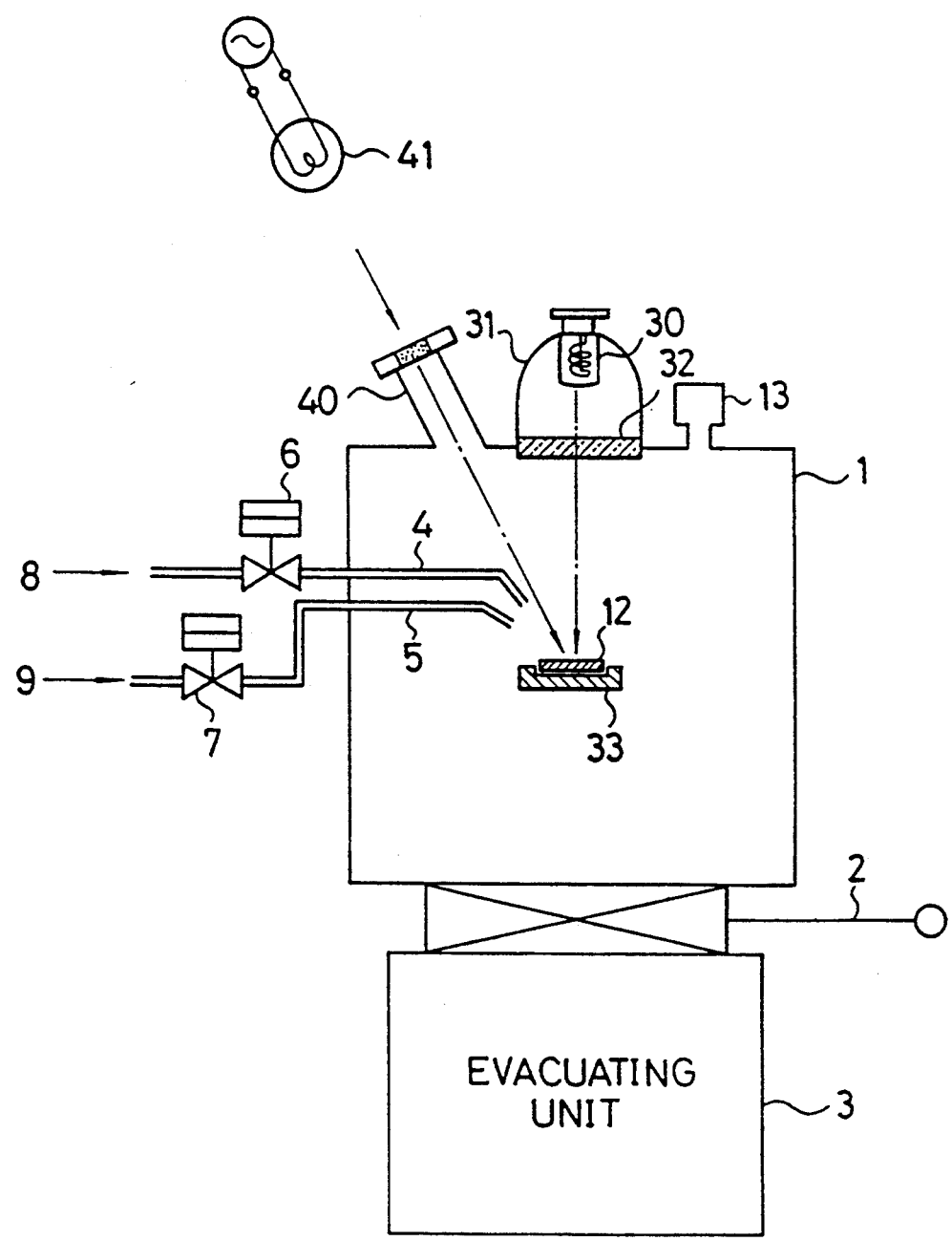
FIG. 4 is a diagrammatic view showing the construction of a crystal growth apparatus preferably used for the practice of another embodiment of the present invention.
Figure 5A:
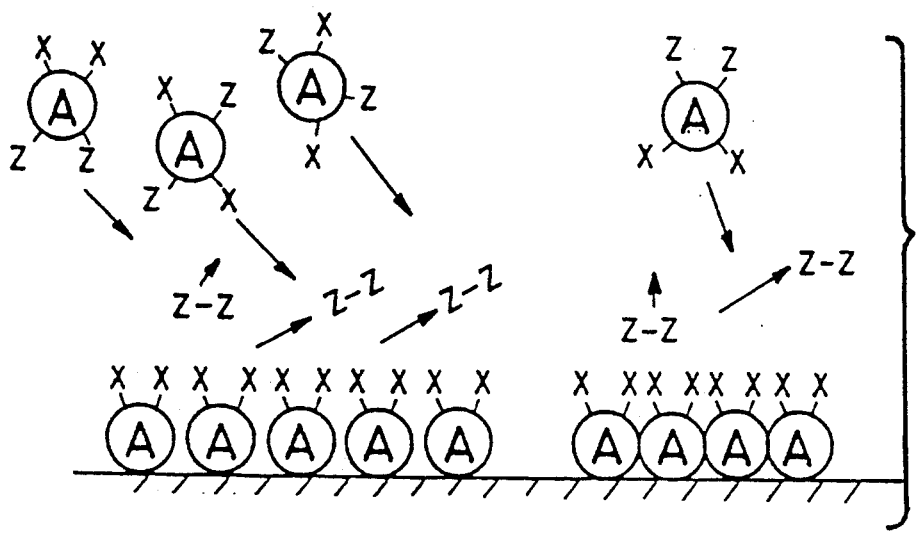
FIGS. 5A–5E are respective schematic views of $AX_2$ adsorption, evacuation, $H_2$ adsorption, reaction and evacuation, and $AX_2$ adsorption in accordance with the present invention.
Figure 5B:
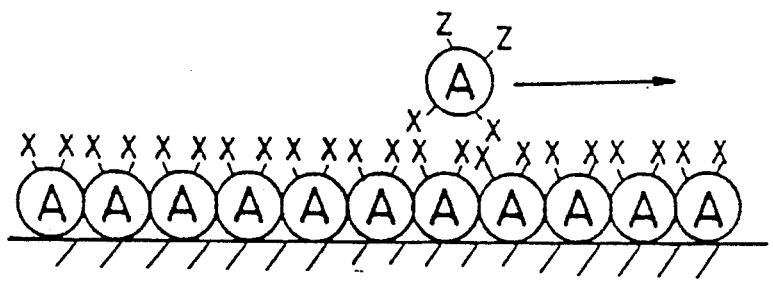
Figure 5C:
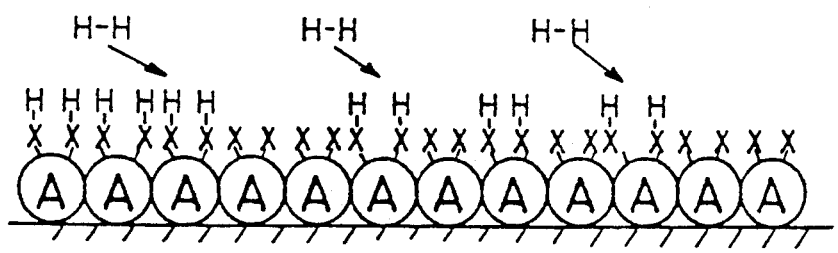
Figure 5D:
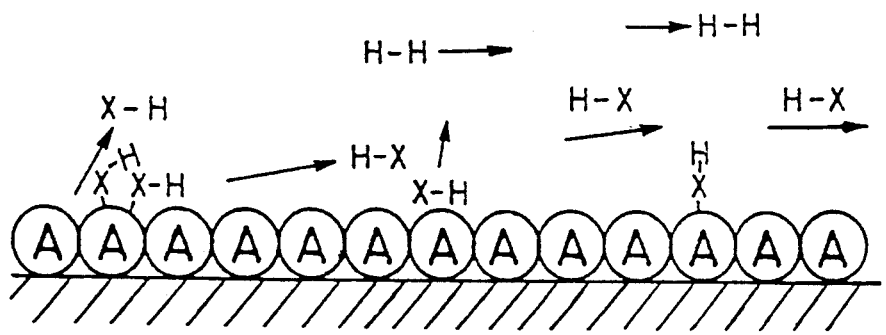
Figure 5E:
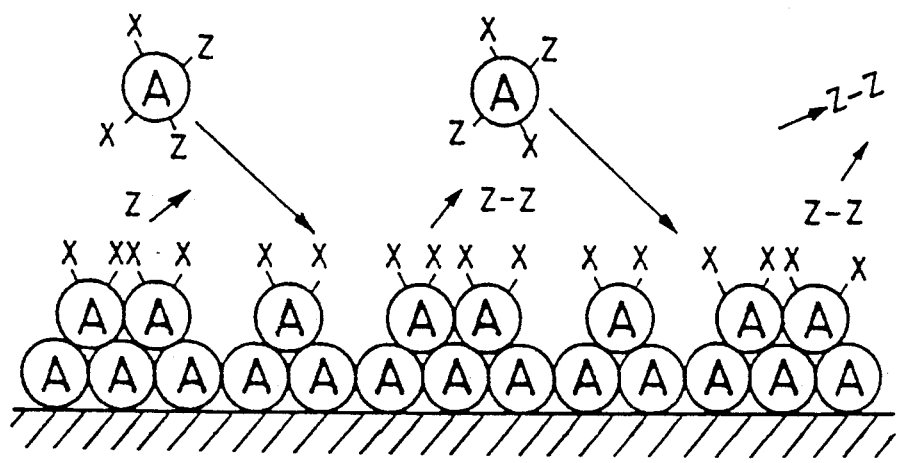

The aforementioned embodiments have referred to the case where the heat source for heating the substrate 12 is disposed in the growth vessel 1. However, as, for example, shown in FIG. 4, an infrared radiation emitting lamp 30 housed in a lamp housing 31 disposed outside of the growth vessel 1 may be used as the heat source, and the infrared radiation emitted from the lamp 30 may be directed toward and onto the substrate 12 through a quartz glass window 32, thereby heating the substrate 12 supported on a susceptor 33. The arrangement shown in FIG. 4 is advantageous in that members unnecessary for the crystal growth can be removed from the interior of the growth vessel 1, and generation of unnecessary gas components including, for example, a heavy metal due to heating by the heater 10 can be eliminated.

Further, an optical system 40 may be mounted on the growth vessel 1, and an external light source 41 such as a mercury lamp, a heavy hydrogen lamp, a xenon lamp, an excimer laser or an argon laser may be provided to direct light having a wavelength of from 180 to 600 nm toward and onto the substrate 12. When such members are provided, the temperature of the substrate 12 can be decreased to cause growth of a single crystal having a higher quality. Surface reactions, such as surface migration, may be promoted by irradiating the surface of the substrate with a light having a wavelength between 180 and 600 nm so that a single crystal of higher quality can be obtained at a lower temperature than would otherwise be the case if the substrate was merely heated with infrared radiation.

In the aforementioned embodiments, an ion pump or the like well known in the art can be used as the ultrahigh-vacuum evacuating unit. Further, an auxiliary vacuum vessel and a crystal transport unit for the insertion and transport of the monocrystalline substrate can be easily added to improve the mass productivity.

The aforementioned embodiments have referred principally to the introduction of gas containing Si used for the crystal growth. However, in theory, the gas of a semiconductor such as Ge belonging to the IV group can also be used. Also, the material of the substrate is not limited to silicon and may be sapphire, spinel, or the like.

FIGS. 5A-5E show an embodiment of the present invention. A source of gas containing gaseous molecules of a first compound, e.g., $SiH_2Cl_2$, is first introduced. The compound contains an element of the element semiconductor, i.e. Si, which is adsorbed on the surface of the substrate as a second compound, e.g., $SiCl_2$, due to the partial dissociation (decomposition) of the compound to release $H_2$. Since the compound undergoes partial dissociation, a portion of the compound including the element of the element semiconductor is adsorbed on the surface of the substrate, i.e. $SiCl_2$, while a portion of the compound is released, i.e. $H_2$.

In other words, with respect to the condition permitting the reaction $SiH_2Cl_2 \rightarrow SiCl_2 + H_2$ (A) occurs, while avoiding the reaction $SiH_2Cl_2 \rightarrow Si + 2HCl$ (B), the depends on the substrate temperature. Thus, the reaction (A) is dominant at a relatively low temperature while the reaction (B) is dominant at a relatively high temperature. However, since Si is directly deposited on the substrate in the reaction (B), the film growth thickness per cycle would not be saturated for a pressure range of gas introduction but would be increased with increasing gas introduction pressure so that the inventive monolayer growth per cycle would not be achieved with the reaction (B). On the contrary, the invention is directed primarily to use of a low substrate temperature for which the reaction (B) does not occur. The critical temperature above which the reaction (B) is dominant is actually about 900° C.

As a general example, assume that a source gas of $AX_2Z_2$ (where A is the element of the element semiconductor) undergoes partial dissociation with the $AX_2$ being adsorbed onto the substrate and $Z_2$ molecules being discharged. Thus, a single molecular layer of $AX_2$ is formed on the substrate, assuming the temperature, pressure and time limits within the monolayers formation range are adhered to. After the adsorption of a single molecular layer comprising $AX_2$, excess source gas $AX_2Z_2$ and $Z_2$ molecules are evacuated. Thereafter gaseous molecules chemically reactable with the molecules $AX_2$ which were adsorbed on the substrate, are introduced and adsorbed on the previously formed monolayer of $AX_2$. An example of chemically reactable gaseous molecules is $H_2$. As a result of the introduction of the $H_2$ molecules, there is a surface reaction which forms HX molecules. These HX molecules are removed off the surface of the substrate yielding a monatomic layer of A atoms on the surface of the substrate.

In one cycle of gas introductions of $AX_2Z_2$ and $H_2$ such as described above, a single molecular layer of elemental semiconductor A may be formed. By simply repeating such a cycle a desired number of times, a desired film thickness of the elemental semiconductor may be obtained corresponding to the number of cycles, without the need to provide any special device for controlling or monitoring the film thickness, or to precisely control the amount of source gas introduced into the cycle.

According to U.S. Pat. No. 4,058,430 (Suntola), a prior art process (referred hereafter as "Suntola process") for making compound semiconductors is shown in FIGS. 6A–6E. A monatomic layer of A atoms is first adsorbed on the surface of a substrate, and excess A atoms are evacuated. Because the A—A bond is prevented under the conditions of the Suntola process, it is impossible to form a second monatomic layer of A atoms on the previously formed monatomic layer of A atoms. Then B atoms are supplied and a monatomic layer of B atoms is formed on the previously formed monatomic layer of A atoms. Excess B atoms are evacuated. A monolayer or compound AB is thereby formed.

As described above it is impossible, under the conditions of the Suntola process, to form a second monatomic layer of A atoms on a previously formed layer of A atoms.

In the present invention, the introduced $H_2$ molecules enter a surface reaction which creates reactant compound molecules HX, which molecules are removed off of the surface of the substrate, leaving only a monatomic layer of A atoms that had been initially adsorbed on the surface of the substrate.

One of the distinguishing characteristics of the present invention is that the thickness of the thin film to be formed may be as precise as a single monolayer. A thickness of the thin film in multiples of a monolayer thickness may be obtained by simply counting the number of cycles of gas introduction without any other means for monitoring the thickness of the thin film and without precisely controlling the amount of introduced source gas. The amount of gas introduced need not be controlled precisely as long as the gas is introduced under the saturation conditions at one monolayer thickness.

Figure 7:
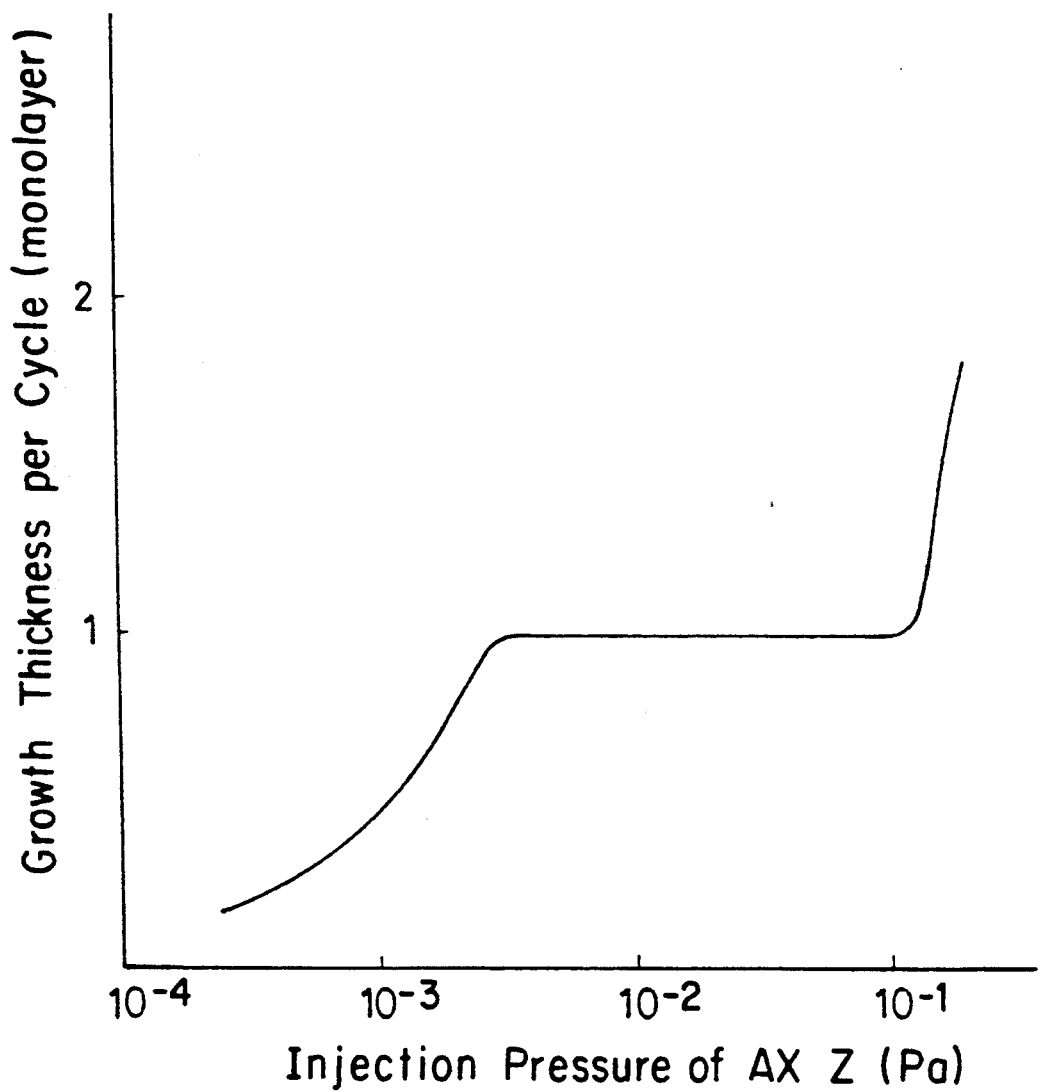
FIG. 7 is a graphical representation of growth thickness per monolayer growth cycle versus injection pressure of $AX_2Z_2$ in accordance with the present invention.

The relationship between the growth thickness per cycle of gas introduction and the injection pressure of gaseous molecules $AX_2Z_2$ is shown in FIG. 7. As can readily be seen from this graph, the film growth thickness per cycle is saturated to the thickness of one monolayer for a pressure range of $3 \times 10^{-3}$ to $10^{-1}$ Pa. Within this pressure range, the growth thickness per cycle is precisely determined as one monolayer thickness, even if the introduced amount of source gas is slightly changed.

A film may be grown without the introduction of $H_2$ gas, by introducing only $AX_2Z_2$ gas. However, the relationship of film growth thickness per cycle to injection pressure, without $H_2$ gas, is not saturated for any injection pressure of $AX_2Z_2$. It therefore becomes necessary, when $H_2$ is not introduced, to precisely control the injection pressure of supply gas, the introduced amount of supply gas and the growth temperature to obtain a growth of one monolayer thickness.

Figure 8A:
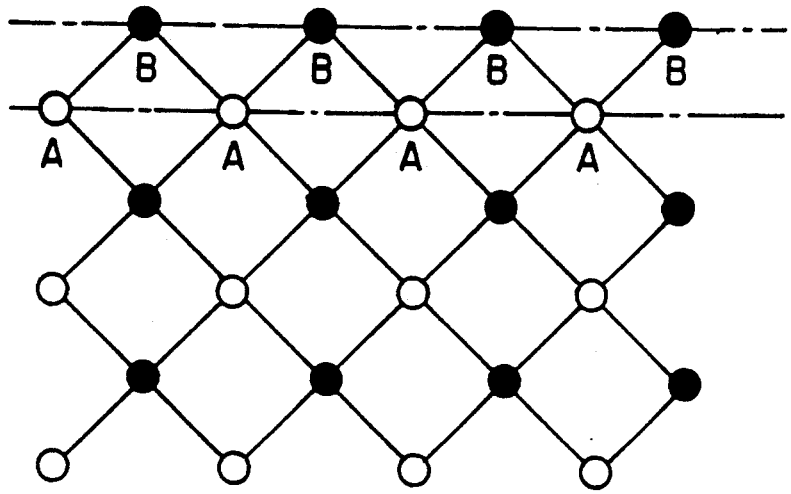
FIG. 8A and 8B are schematic representations of models of, respectively, compound AB and a single element crystal A doped with an impurity element C.
Figure 8B:
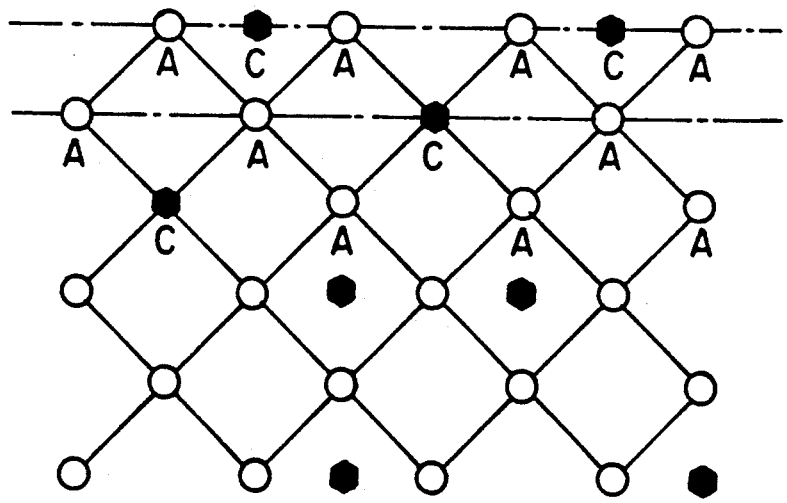

FIG. 8A shows a model of a compound AB and FIG. 8B shows a model of single element crystal A doped with an impurity element C. In the compound AB, atoms A and atoms B are regularly arranged while in the crystal A doped with C, the impurity atoms C are locally distributed irregularly or at random. For the purpose of clarity, a grossly exaggerated number of C atoms are shown in FIG. 8B. However, since the quantity of impurity atoms C which may be occluded in the crystal A is limited by the solid solubility of the crystal A, the quantity of impurity atoms C is really at most about 1/100 of the quantity of A atoms. Usually, the ratio of the number of C atoms to A atoms in the crystal is about $10^{-5}$ to $10^{-10}$. But, in a compound such as AB, the number of A atoms and B atoms is the same.

Furthermore, the uppermost layer of the compound shown in FIG. 8A is entirely occupied by B atoms while the next layer is entirely occupied by A atoms. In the case of single element crystal A doped with impurity C shown in FIG. 8B, both the uppermost layer and the next layer contain A and C atoms. The position occupied by a C atom may be either a lattice site (2nd and 3rd layers) or a mid-point between lattice sites (uppermost layer).

Since the strength of the binding force of the A—B bond and the A—C bond are different, the amount of energy required for the growth of AB single crystal and that required for doping the single crystal A with impurity C are also different. Accordingly, the conditions or methods for the growth of an AB single crystal and for doping the single crystal A with impurity C are also different.

In a typical compound semiconductor manufactured by the semiconductor industry, the A—B bond is a strong covalent bond and there will never occur excess or deficiency electrons in forming the A—B bond. In a typical single element Si semiconductor, Si is a IV group element while an impurity element which will be used for doping is a III or V group element. Therefore, an excess or a deficiency of an electron may occur in forming the A—C bond. It is the object of doping to produce such an excess or deficiency of electrons which permit various semiconductors to operate.

Each B atom shown in FIG. 8A is fixed at its lattice site, while each impurity atom C shown in FIG. 8B may easily be diffused to other positions. Doping a single crystal A with an impurity C is different from forming compound AB.

FIGS. 9A-9D show the steps of forming an element semiconductor A with a dopant C which corresponds to the present application.

Figure 9A:
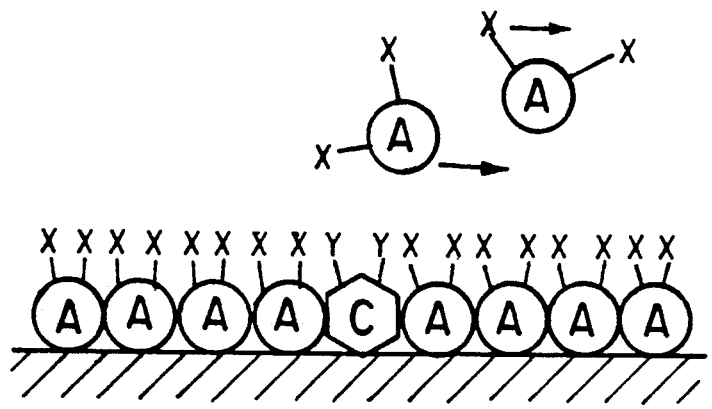
FIGS. 9A–9D are a cyclic representation of the steps for forming an element semiconductor A with a dopant C in accordance with the invention, i.e., adsorption of $AX_2$ and $CY_2$ molecules, adsorptions of $H_2$ molecules, surface reaction and evacuation, and adsorption of $AX_2$ molecules and $CY_2$ molecules.
Figure 9B:
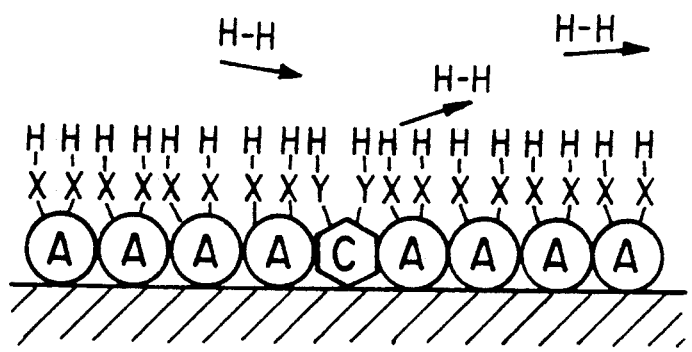
Figure 9C:
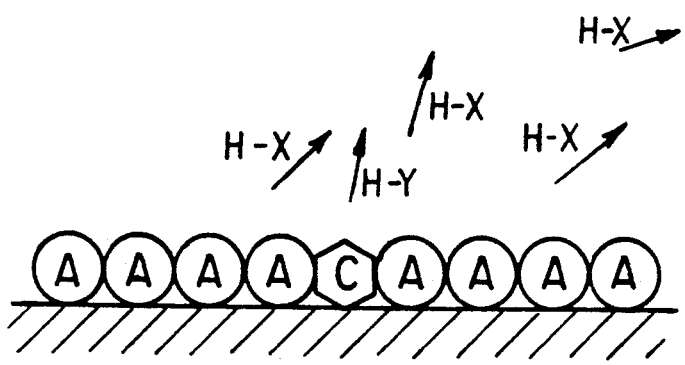
Figure 9D:
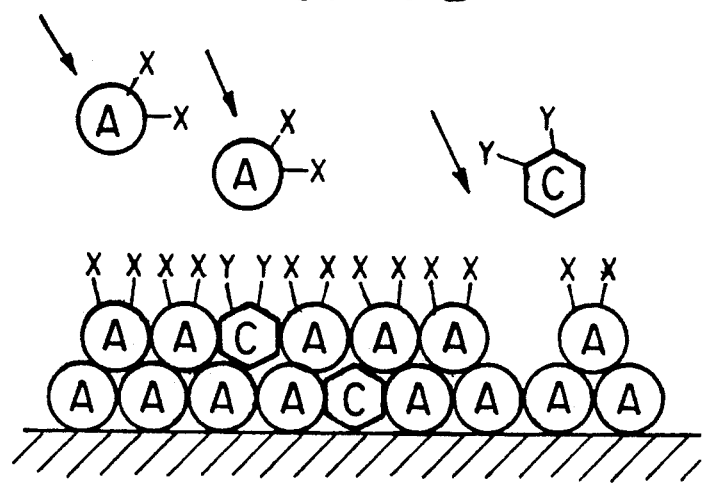

In FIG. 9A, a quantity of $AX_2$ compound molecules and a very small quantity of $CY_2$ compound molecules are simultaneously supplied onto the surface of a substrate so as to obtain the adsorption of a monolayer comprising $AX_2$ and $CY_2$ molecules on the substrate, and excess molecules are evacuated. In FIG. 9B, $H_2$ molecules are then supplied so as to obtain the adsorption of a monolayer of $H_2$ onto the surface of the previously formed monolayer of compounds, and excess $H_2$ molecules are evacuated. Then, as shown in FIG. 9C, H—X and H—Y molecules formed as a result of the surface reaction are removed from the surface of the substrate leaving on the surface a monatomic layer comprising a majority of A atoms and a minority of C atoms. FIG. 9D, which is different from the Suntola '430 process, shows a second monolayer comprising $AX_2$ and $CY_2$ formed by again supplying $AX_2$ and $CY_2$ molecules which results in the formation of another monatomic layer, comprised of a majority of A atoms and a minority of C atoms. Thus, according to the invention, monolayer growth per cycle may be attained even with doping.

The process of the invention has been described above for the case where $AX_2$ and $CY_2$ are supplied simultaneously. Doping may also be attained by the simultaneous supply of $H_2$ and $CY_2$ which will now be described with reference to FIGS. 10A-10D.

Figure 6A:
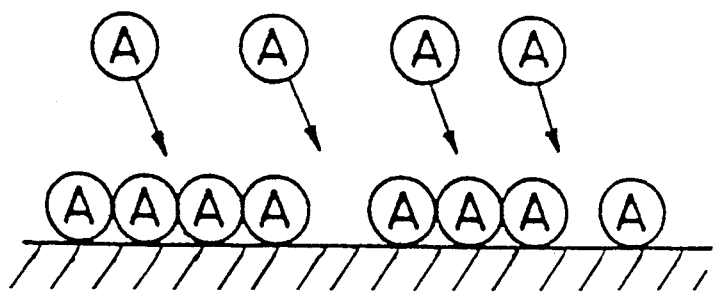
FIGS. 6A–6E are respective schematic views of A atoms adsorption, evacuation, B atoms adsorption, evacuation and A atoms adsorption in accordance with the prior art.
Figure 6B:
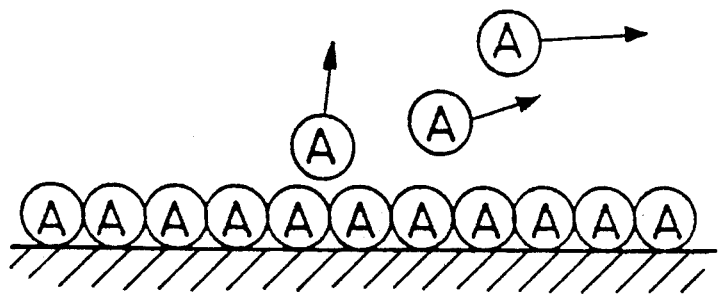
Figure 6C:
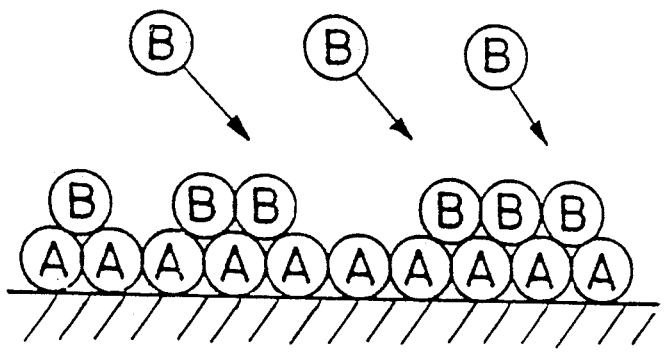
Figure 6D:
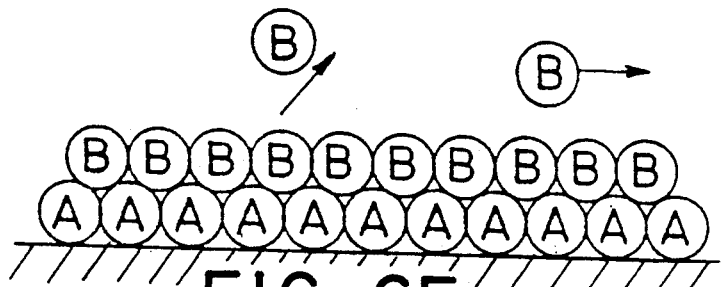
Figure 6E:
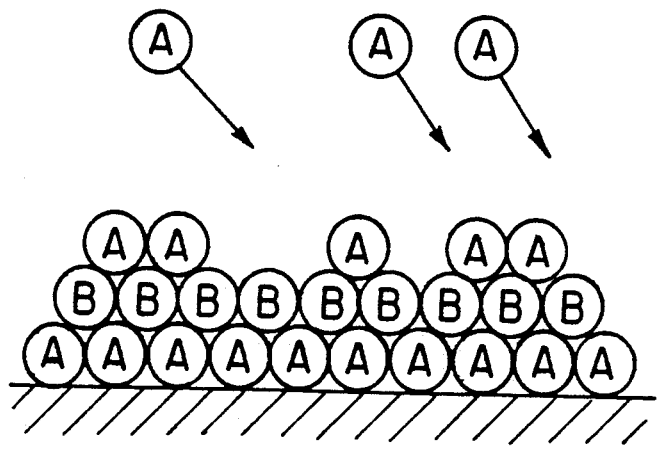
Figure 10A:
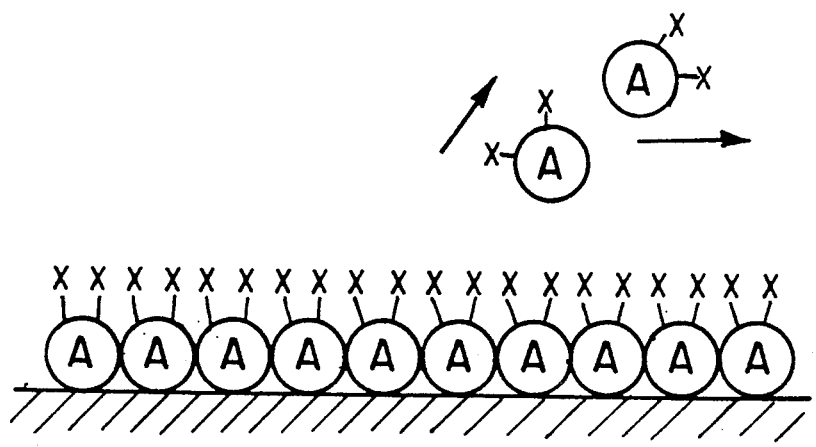
FIGS. 10A–10D are a cyclic representation of the steps for forming a doped element semiconductor A from the simultaneous supply of $H_2$ and $CY_2$ where C is a dopant. The steps are, respectively, adsorption $AX_2$ molecules, adsorption of $H_2$ molecules and $CY_2$ molecules, surface reaction and evacuation, $AY_2$ molecules adsorption.
Figure 10B:
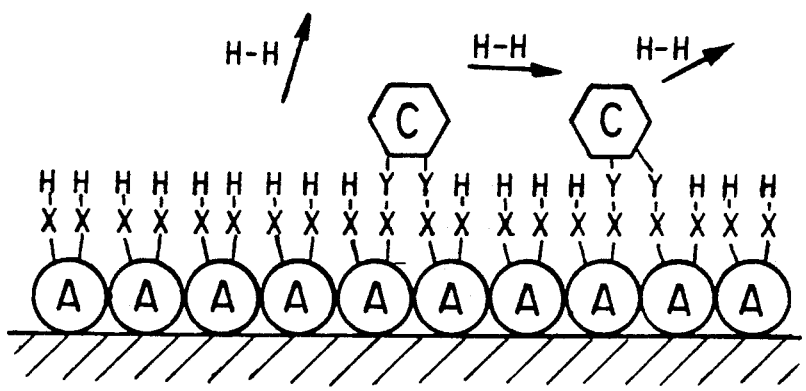
Figure 10C:
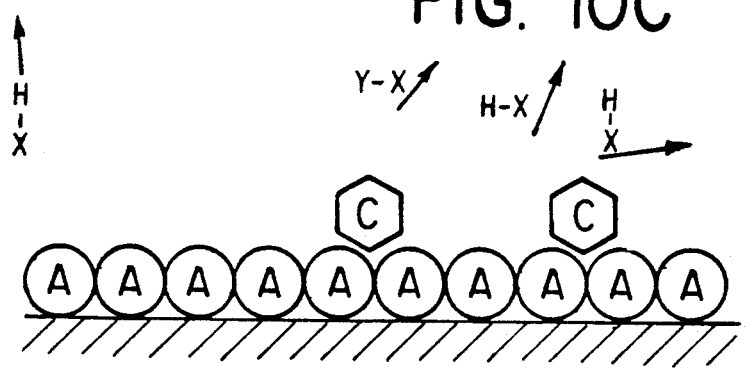
Figure 10D:
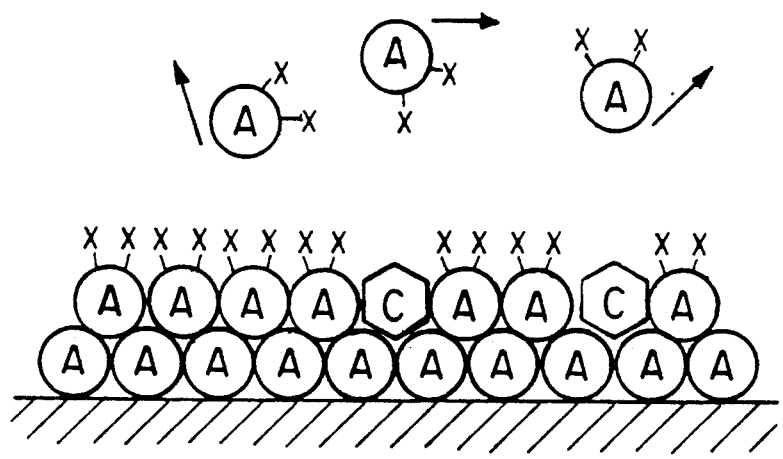

In FIG. 10A, a monolayer of $AX_2$ molecules is first adsorbed on the surface of a substrate, and excess $AX_2$ molecules are evacuated. In FIG. 10B, $H_2$ molecules and $CY_2$ molecules comprising an impurity C, are supplied simultaneously so as to obtain the adsorption of a monolayer comprising $H_2$ and $CY_2$ on the previously formed monolayer of $AX_2$, and excess molecules of $H_2$ and $CY_2$ are evacuated. In FIG. 10C, H—X and Y—H which are formed as a result of the surface reaction are removed from the surface and evacuated. In FIG. 10D, $AX_2$ molecules are again supplied so that a second monolayer of $AX_2$ is formed. Thus, as contrasted to the Suntola process as shown in FIG. 6A, the monolayer growth of single element crystal A is attained by one cycle of gas introduction.

Figure 11:
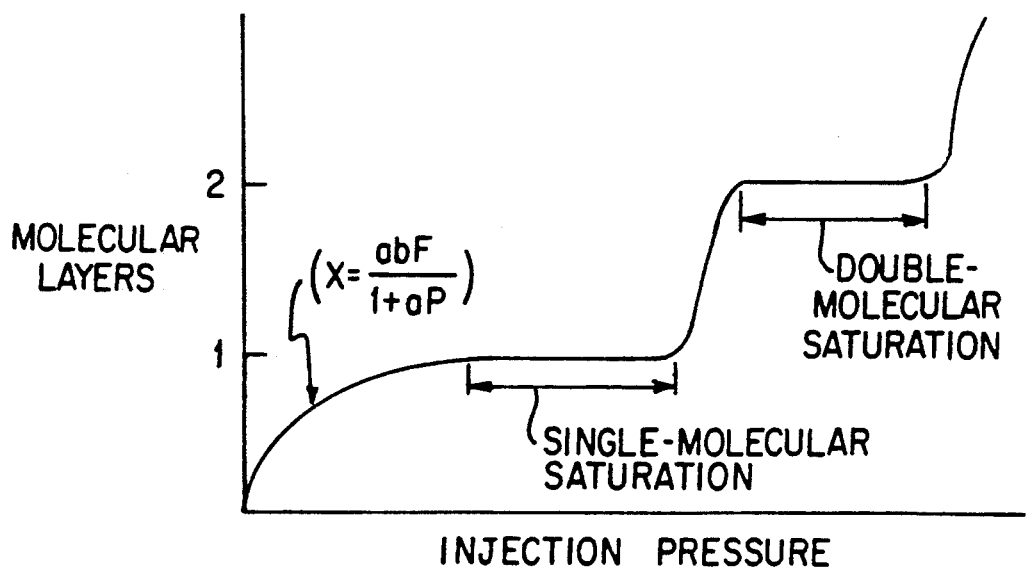
FIG. 11 is a graphical representation of the relationship of the formation of molecular layers as a function of injection pressure.

FIG. 11 illustrates the relationship between single and double-molecular growth and injection pressure. Upon the first injection of the gaseous molecules of the first compound, the substrate adsorbs a first single-molecular layer (per one cycle) and, if the gas injection pressure is raised, double-and triple-molecular layers are adsorbed.

According to the well known adsorption formula of Langmuir, the amount $X$ of gas molecules adsorbed under a gas injection pressure P is given, on the hypothesis that the molecules are deposited on the substrate without any room, by $$x = \frac{abP}{1 + aP} \quad \text{(at constant temperature)}$$

Where a is a constant. When $P \gg 1$, x will saturate to b. Namely, as the pressure is raised above a certain value, the thickness of the adsorption layer will saturate to a single-layer film thickness, wherein the self-limiting growth rate property of this invention is obtained. This saturation pressure is, for $SiH_2Cl_2$ introduction and deposition of $SiCl_2$ on the substrate in particular, in the range of $3 \times 10^{-3}$–$10^{-1}$ Pa. If the pressure is raised above $10^{-1}$ Pa, deposition of double-molecular layer and triple-molecular layer may be obtained in adsorption. However, since such multiple-molecular layers have rough surfaces and not mirror-like, and further more have poor crystalline structures, they are not usually utilized. In other words, single-molecular adsorption is preferred, though multiple-molecular layers can be obtained. Of the values of the pressure, $1$–$10^{-7}$ Pa, the pressures above $10^{-1}$ Pa refer to adsorption of a multiple-molecular layer, while $10^{-1}$ to $10^{-7}$ Pa implies a low pressure region for the adsorption of a single-molecular layer.

Obviously, the minimum pressure can be deduced easily, because the number of molecules introduced on the substrate must be much larger than that required to perfectly cover the substrate surface by a single-molecular layer. The density of surface atoms of the semiconductor substrate is approximately $10^{15}$ cm$^{-3}$ as disclosed in the Suntola process. The minimum pressure multiplied by the gas introducing time corresponds to the minimum number of molecules introduced. In the case of $10^{-7}$ Pa, it will take a very long gas introducing time to perfectly cover the substrate. Hence, the minimum pressure of $3 \times 10^{-3}$ Pa is recommended.

While the foregoing description and drawings represent the preferred embodiments of the present invention, it will be understood that various changes and modifications may be made without departing from the spirit and scope of the present invention.

What is claimed is:

1. A process for forming a monocrystalline thin film of silicon on a silicon substrate located in a crystal growth vessel, comprising the steps of:

(a) evacuating the interior of the crystal growth vessel to an evacuation pressure;

(b) heating the substrate to, and maintaining the substrate at, a temperature within a range of from about 700 to 900 degrees C;

(c) introducing a first supply of gaseous molecules of $SiH_2Cl_2$ onto the substrate disposed in the growth vessel for a first period of time of from about 0.5 to 200 seconds while maintaining the internal pressure of the growth vessel under a saturation condition within the range of from about $3 \times 10^{-3}$ to $10^{-1}$ Pascal to form a single molecular ad-layer of a second compound dissociated from the gaseous molecules of $SiH_2Cl_2$ on the substrate, said second compound containing silicon;

(d) evacuating the interior of said crystal growth vessel to remove molecules other than those which form said single molecular ad-layer;

(e) introducing a second supply of gaseous molecules reactable with said single molecular ad-layer for a second time period of from about 0.5 to 200 seconds, while maintaining the internal pressure of the growth vessel under the saturation condition within the range of from about $3\times 10^{-3}$ to $10^{-1}$ Pascal so as to chemically react with said single molecular ad-layer to form gaseous molecules of a reactant compound;

(f) evacuating said growth vessel to remove the gaseous molecules of said second supply and said reactant compound so as to leave a monocrystalline thin film with the thickness of a single molecular layer of silicon;

(g) cyclically repeating the sequence of steps (c) to (f) and maintaining the substrate at said temperature to grow the monocrystalline thin film of silicon on the substrate to a desired thickness which is dimensionally as precise as that for a single molecular layer, the desired thickness being attained by cycling the sequence of steps (c) to (f) by a plurality of times equivalent to an integral result of a division of the desired thickness of the monocrystalline thin film of silicon by a thickness of the single molecular monolayer of silicon; and (h) continuously evacuating the crystal growth chamber during steps (c) to (g) at a substantially constant rate of evacuation, the gaseous molecules being introduced during steps (c) and (e) including a respective amount which is in excess of that necessary for forming just the single molecular layer of silicon during each cycle even taking into account a removal rate of the gaseous molecules caused by the evacuation taking place during steps (c) and (e).

2. A process as claimed in claim 1 wherein the second supply of gaseous molecules is a supply of hydrogen.

3. A process as claimed in claim 1, wherein the step of heating is accomplished by an infrared radiation source provided to direct radiation toward and onto said substrate, thereby heating said substrate to said temperature.

4. A process as claimed in claim 1, wherein the surface reaction during the crystal growth is promoted by a radiation source provided to direct radiation having a wavelength between 180 and 600 nm toward and onto said substrate so as to obtain the crystal of higher quality grown at a lower temperature.

5. A process as claimed in claim 3 further including the step of introducing gaseous molecules containing a dopant of the element semiconductor alternately with said first supply of gaseous molecules so that growth of a monocrystalline thin film of silicon having a desired dopant concentration distribution in the thicknesswise direction is attained with precision as precise as a single molecular layer.

6. A process as claimed in claim 5, wherein the gaseous molecules containing those of a dopant element contain at least two dopant elements, said at least two dopant elements being cyclically introduced.

7. A process as claimed in claim 6, wherein said at least two dopant elements are introduced in respectively different cycles, whereby the at least two dopant elements are cyclically doped in respectively different molecular layers.

8. A process as claimed in claim 7, wherein the atomic radius of one of the at least two dopant elements is larger than that of said element semiconductor, and the atomic radius of another of the at least two dopant elements is smaller than that of said element semiconductor.

9. A process as claimed in claim 7, wherein one of the at least two impurity elements is an element of the IV group.

10. A process as claimed in claim 7, wherein the at least two dopant elements are of the same conductivity type.

11. A process as claimed in claim 7, wherein said at least two dopant elements are introduced at respectively different times so that the at least two dopant elements are cyclically doped in respectively different molecular layers.

12. A process as claimed in claim 1 wherein, during the step of cyclically repeating the sequence of steps (c) to (f), gaseous molecules containing those of a dopant element of silicon are cyclically introduced simultaneously with said second supply of gaseous molecules so that a molecular layer doped with the dopant element and a molecular layer not doped with the dopant element are cyclically formed.

13. A process as claimed in claim 12, wherein the gaseous molecules containing those of a dopant element contain at least two dopant elements, said at least two dopant elements being cyclically introduced.

14. A process as claimed in claim 13, wherein said at least two dopant elements are introduced in respectively different cycles whereby the at least two dopant elements are doped in respectively different molecular layers.

15. A process as claimed in claim 14, wherein the atomic radius of one of the at least two dopant elements is larger than that of said element semiconductor, and the atomic radius of another of the at least two dopant elements is smaller than that of said element semiconductor.

16. A process as claimed in claim 14, wherein one of the at least two dopant elements is an element of the IV group.

17. A process as claimed in claim 14, wherein the at least two dopant elements are of the same conductivity type.

18. A process as claimed in claim 14, wherein said at least two dopant elements are introduced at respectively different times so that the at least two dopant elements are doped in respectively different molecular layers.

19. A process as claimed in claim 1 further including the step of introducing gaseous molecules containing a dopant element of silicon alternately with said second supply of gaseous molecules so that growth of monocrystalline thin film of silicon having a desired dopant concentration distribution in the thicknesswise direction is attained with precision as precise as a single molecular layer.

20. A process as claimed in claim 1 further including the step of introducing gaseous molecules containing a dopant element of silicon simultaneously with said second supply of gaseous molecules so that growth of a monocrystalline thin film of silicon having a desired dopant concentration distribution in the thicknesswise direction is attained with precision as precise as a single molecular layer.

21. A process as claimed in claim 1 wherein, during the step of cyclically repeating the sequence of steps (c) to (f), gaseous molecules containing those of a dopant element of said element semiconductor are cyclically introduced simultaneously with said first supply of gaseous molecules so that a molecular layer doped with the dopant element and a molecular layer not doped with the dopant element are cyclically formed.

22. A process as claimed in claim 20 wherein the gaseous molecules containing a dopant element contain at least two dopant elements, said at least two dopant elements being cyclically introduced.

23. A process as claimed in claim 22, wherein the gaseous molecules containing those of a dopant element contain at least two a dopant elements, said at least two dopant elements being cyclically introduced.

24. A process as claimed in claim 23, wherein said at least two dopant elements are introduced in respectively different cycles whereby the at least two dopant elements are doped in respectively different molecular layers.

25. A process as claimed in claim 23, wherein the atomic radius of one of the at least two dopant elements is larger than that of said element semiconductor, and the atomic radius of another of the at least two dopant elements is smaller than that of said element semiconductor.

26. A process as claimed in claim 23, wherein the at least two dopant elements are of the same conductivity type.

27. A process as claimed in claim 23, wherein said at least two dopant elements are introduced at respectively different times so that the at least two dopant elements are doped in respectively different molecular layers.

28. A process as claimed in claim 1, further comprising the step of selecting a pressure and duration of evacuation of the crystal growth vessel between each successive one of the steps of introducing by taking into account a size of the growth chamber, further comprising the step of selecting a pressure and duration of introducing each gaseous supply of molecules by taking into account the pressure and duration of evacuation and a number of molecules necessary for growing substantially one molecular monolayer of silicon on the substrate at an end of each repetition of the cyclically repeating step.

29. A process as claimed in claim 1, further comprising the step of selecting the temperature being based on varying the temperature within the crystal growth vessel until monolayer growth is observed within the crystal growth vessel immediately after completing steps (a) to (f).

30. A process as claimed in claim 1, further comprising the step of counting a plurality of cycles of the sequence of steps (c) to (f) and stopping step (g) after a count from the step of counting equals the integral result.

31. A process as claimed in claim 1, wherein step (g) takes place without measuring an amount of growth which has taken place on the substrate before repeating the sequence of steps (c) to (f) in accordance with the cyclically repeating of step (g).

32. A process for forming a monocrystalline thin film of silicon on a silicon substrate located in a crystal growth vessel, comprising the steps of:

(a) evacuating the interior of the crystal growth vessel to an evacuation pressure;

(b) heating the substrate to, and maintaining the substrate at, a temperature within a range of from about 700 to 900 degrees C;

(c) introducing a first supply of gaseous molecules of $SiH_2Cl_2$ onto the substrate disposed in the growth vessel for a first period of time of from 0.5 to 200 seconds while maintaining the internal pressure of the growth vessel under a saturation condition within the range of from about $10^{-1}$ to 1 Pascal to form a multiple molecular ad-layer of a second compound dissociated from the gaseous molecules of $SiH_2Cl_2$ on the substrate, said second compound containing silicon;

(d) evacuating the interior of said crystal growth vessel to remove molecules other than those which form said multiple molecular ad-layer;

(e) introducing a second supply of gaseous molecules reactable with said multiple molecular ad-layer for a second time period of from about 0.5 to 200 seconds, while maintaining the internal pressure of the growth vessel under the saturation condition within the range of from about $10^{-1}$ to 1 Pascal so as to chemically react with said multiple molecular ad-layer to form gaseous molecules of a reactant compound;

(f) evacuating said growth vessel to remove the gaseous molecules of said second supply and said reactant compound so as to leave a monocrystalline thin film with the thickness of a multiple molecular layer of silicon;

(g) cyclically repeating the sequence of steps (c) to (f) and maintaining the substrate at said temperature to grow the monocrystalline thin film of silicon on the substrate to a desired thickness which is dimensionally as precise as that for a multiple molecular layer, the desired thickness being attained by cycling the sequence of steps (c) to (f) by a plurality of times equivalent to an integral result of a division of the desired thickness of the monocrystalline thin film of silicon by a thickness of the multiple molecular monolayer of silicon; and (h) continuously evacuating the crystal growth chamber during steps (c) to (g) at a substantially constant rate of evacuation, the gaseous molecules being introduced during steps (c) and (e) including a respective amount which is in excess of that necessary for forming just the multiple molecular layer of silicon during each cycle even taking into account a removal rate of the gaseous molecules caused by the evacuation taking place during steps (c) and (e).

33. A process as in claim 32, wherein said multiple molecular layer is a double molecular layer.

34. A process as in claim 32, wherein said multiple molecular layer is a triple molecular layer.

* * * * *